United States Patent
Vogt et al.

(10) Patent No.: US 9,712,116 B2
(45) Date of Patent: Jul. 18, 2017

(54) MULTIPLE RANGE RF AMPLIFIER

(71) Applicant: STMicroelectronics SA, Montrouge (FR)

(72) Inventors: Lionel Vogt, La Rochette (FR); Baudouin Martineau, Tencin (FR); Aurelien Larie, Sabres (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/955,969

(22) Filed: Dec. 1, 2015

(65) Prior Publication Data
US 2016/0173036 A1    Jun. 16, 2016

(30) Foreign Application Priority Data
Dec. 16, 2014    (FR) ..................................... 14 62486

(51) Int. Cl.
*H03F 3/45* (2006.01)
*H03F 1/02* (2006.01)
(Continued)

(52) U.S. Cl.
CPC ......... *H03F 1/0205* (2013.01); *H03F 1/0261* (2013.01); *H03F 3/193* (2013.01); *H03F 3/195* (2013.01); *H03F 3/211* (2013.01); *H03F 3/245* (2013.01); *H03F 3/45179* (2013.01); *H03F 2200/432* (2013.01); *H03F 2200/451* (2013.01); *H03F 2200/516* (2013.01); *H03F 2203/21106* (2013.01); *H03F 2203/45394* (2013.01)

(58) Field of Classification Search
CPC ........... H03F 3/45; H03F 3/68; H03F 3/45179
USPC ......................................... 330/253, 261, 295
See application file for complete search history.

(56) References Cited

U.S. PATENT DOCUMENTS 7,088,178 B1 * 8/2006 Rosenfeld ........... H03F 3/45659
330/253
7,514,998 B2 * 4/2009 Mojarradi ................. H03F 1/30
327/513
(Continued)

FOREIGN PATENT DOCUMENTS

EP            2890005 A1        7/2015

OTHER PUBLICATIONS

Kaymaksut et al: "Transformer-Based Uneven Doherty Power Amplifier in 90 nm CMOS for WLAN Applications," IEEE Journal of Solid State Circuits, vol. 47, No. 7, Jul. 2012, pp. 1659-1671.
(Continued)

*Primary Examiner* — Steven J Mottola
(74) *Attorney, Agent, or Firm* — Gardere Wynne Sewell LLP

(57) ABSTRACT

An amplifier includes at least two amplification stages coupled in parallel. Each amplification stage includes at differential pair of amplifying MOS transistors having gates connected to a first and second input nodes common to amplifying stages, and bulk regions connected to each other but insulated from bulk regions of the amplifying MOS transistors of the other amplification stages. A configuration circuit generates bias voltage for application to the bulk terminals in each amplification stage to set the threshold voltages of the amplifying MOS transistors, and thus configuring the operating range of each amplification stage so that different amplification stages have different operating ranges.

35 Claims, 2 Drawing Sheets

(51) Int. Cl.
*H03F 3/193* (2006.01)
*H03F 3/21* (2006.01)
*H03F 3/195* (2006.01)
*H03F 3/24* (2006.01)

(56) References Cited

U.S. PATENT DOCUMENTS

2007/0298736 A1  12/2007  Fujioka et al.
2010/0041359 A1  2/2010   Liu et al.
2014/0266460 A1  9/2014   Nobbe et al.
2015/0061775 A1* 3/2015   Qureshi ............... H03F 1/0288
                                             330/295

OTHER PUBLICATIONS

INPI Search Report and Written Opinion for FR 1462486 dated Aug. 11, 2015 (7 pages).

* cited by examiner

MULTIPLE RANGE RF AMPLIFIER

PRIORITY CLAIM

This application claims the priority benefit of French Application for Patent No. 1462486, filed on Dec. 16, 2014, the contents of which is hereby incorporated by reference in its entirety to the maximum extent allowable by law.

TECHNICAL FIELD

The present disclosure generally relates to the field of electronic circuits and, more specifically, to that of power amplifiers. It particularly aims at a power amplifier for radio frequency signals (RF), comprising at least two output stages configurable to operate in different amplitude ranges of the input signal.

BACKGROUND

RF signals used for digital data transmission standards (for example, signals having a frequency in the range from 3 kHz to 300 GHz) are often characterized by high peak power-to-average power ratios. An amplifier for such signals should be capable of amplifying the peak amplitude in the same conditions as the average amplitude. However, in practice, the amplifier most of the time processes signals close to the average amplitude.

If the amplifier comprises a single output stage operating, to have a good linearity, in class A or AB, the quiescent current of the amplifier is proportional to the current that it should provide for peak amplitudes. When the amplifier processes signals of lower amplitude, that is, most of the time, the quiescent current of the output stage, and thus its power consumption, are unnecessarily high, which results in a poor general efficiency.

To improve the efficiency, it has already been provided to form an amplifier comprising a main output stage configured to operate in class A or AB, having its quiescent current adjusted to linearly amplify signals of medium power, and an auxiliary output stage configured to operate in class B or C, that is, to only amplify the portion of the input signal which exceeds a given power threshold. The auxiliary stage is set to start amplifying when the main stage starts saturating. As long as the turn-on threshold of the auxiliary stage has not been reached, this stage consumes no current. The sum of the outputs of the two amplification stages then corresponds to the signal that the main stage would provide if it did not saturate.

FIG. 1 is a simplified diagram illustrating this type of operation in further detail. More particularly, FIG. 1 illustrates the variation of power Pout of the output signal according to power Pin of the input signal. When power Pin is lower than a threshold T, main amplification stage A1 operates in a linear area of a transfer curve H(A1) (in full line in the drawing). When input power Pin exceeds threshold T, the main amplification stage starts saturating, as shown by the flattening of curve H(A1), and auxiliary amplification stage A2 starts operating according to a transfer curve H(A2) (in full line in the drawing). The main stage then generates a clipped output signal, and the auxiliary stage only amplifies the portion of the input signal which exceeds threshold T. General output power Pout is formed by the sum of the outputs of the two amplification stages. Its variation is shown by a transfer curve H(A1+A2) (in dotted lines). The auxiliary output stage also ends up saturating, which is shown as a flattening of curves H(A2) and H(A1+A2). Thus, the gain compression, and then the saturation, of main amplification stage A1, of class A or AB, are compensated by the gain expansion of auxiliary amplifier A2, of class B or C, to obtain, by combination, a substantially linear response across an extended power range.

An example of an amplifier with two output stages operating in different input signal amplitude ranges is particularly described in article "Transformer-Based Uneven Doherty Power Amplifier in 90 nm CMOS for WLAN Applications" (Solid-State Circuits, IEEE, vol. 47, no 7, pp. 1659-1671, July 2012, incorporated by reference).

More generally, many amplifiers of this type, generally called Doherty amplifiers, have already been provided.

A disadvantage of existing architectures of multi-range amplifiers is that they generally comprise power division circuits at the input of the assembly of output stages and/or power combiner circuits at the output of the assembly of output stages. Such circuits have the disadvantage of being relatively bulky, and of generating power losses at least partially compensating the efficiency gain provided by the association of a plurality of output stages having different operating ranges.

In practice, in existing architectures, the number of output stages with different operating ranges capable of being associated in a same amplifier is limited to two, particularly due to the losses and to the bulk associated with the power division and/or combiner circuits. The general efficiency of the amplifier thus remains relatively poor.

SUMMARY

In an embodiment, an RF amplifier comprises: at least two amplification stages coupled in parallel, each stage comprising at least a first amplifying MOS transistor having its gate connected to a first input node common to said stages, having a first source or drain region connected to a first output node common to said stages, and having its bulk region insulated from the bulk regions of the amplifying MOS transistors of the other stages; and a configuration circuit capable of applying to each stage, on a node for biasing the bulk region of said at least one first amplifying MOS transistor of the stage, a voltage for configuring the operating range of the stage, different from the configuration voltages applied to the other stages.

According to an embodiment, each stage further comprises a second amplifying MOS transistor having its gate connected to a second input node common to said stages, having a first source or drain region connected to a second output node common to said stages, and having its bulk region connected to the bulk region of the first transistor of the stage.

According to an embodiment, in each stage, the first and second transistors form a common-source differential pair.

According to an embodiment, each amplifying MOS transistor has a second source or drain region connected to a node of application of a reference potential common to said stages.

According to an embodiment, the configuration circuit is capable of simultaneously configuring at least one stage in class A or AB, and at least another stage in class B or C.

According to an embodiment, the amplifying MOS transistors are transistors formed in SOI, FDSOI, or FINFET technology.

According to an embodiment, the amplification stages are integrated in a same semiconductor chip.

According to an embodiment, different MOS amplification stages have different dimensions.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
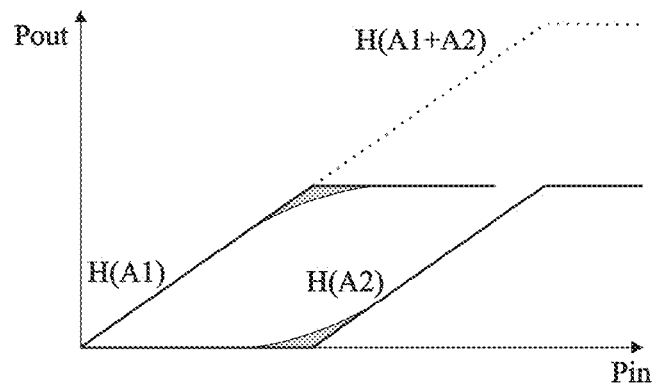
FIG. 1, previously described, is a diagram schematically illustrating curves of transition between the operating ranges of a dual-range amplifier.
Figure 3:
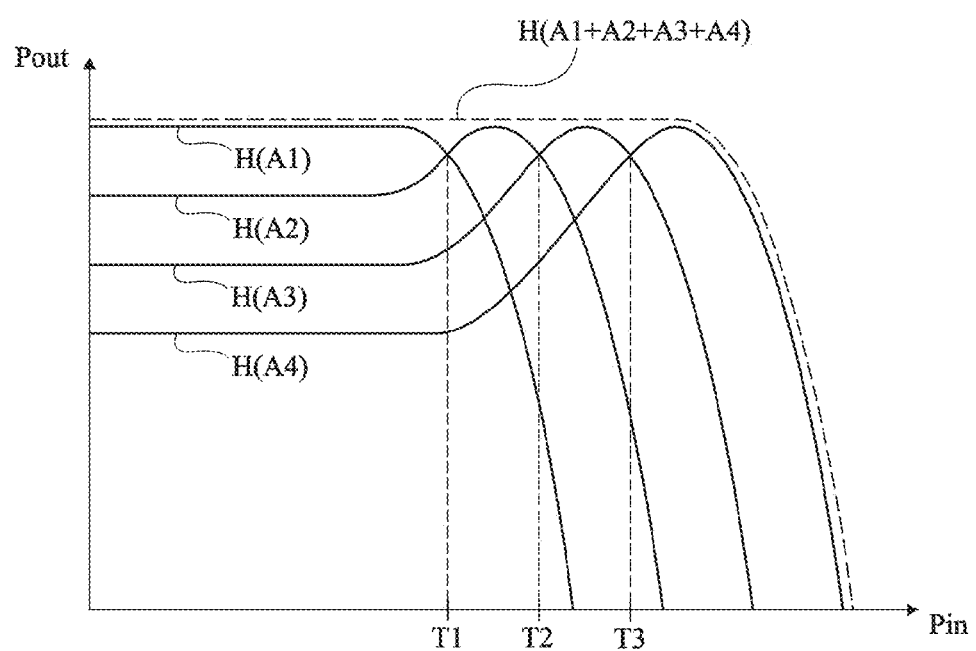
FIG. 3 is a diagram schematically illustrating curves of transition between the different operating ranges of a multi-range amplifier of the type described in relation with FIG. 2.

For clarity, the same elements have been designated with the same reference numerals in the various drawings and, further, the diagrams of FIGS. 1 and 3 are not to scale. Further, only those elements which are useful to the understanding of the described embodiments have been detailed. In particular, in the present disclosure, only the forming of the assembly of output stages of a multi-range amplifier is detailed. The different elements of the amplifier likely to be placed upstream or downstream of the assembly of output stages (input stage, impedance matching circuit, etc.) have not been detailed, the described embodiments being compatible with circuits usually coupled to the input and/or to the output of an output stage of an RF amplifier having a single operating range. Further, in the present disclosure, term "connected" is used to designate a direct electric connection, with no intermediate electronic component, for example, by means of a conductive track, preferably having a length shorter than 5% of the wave-length of the signal to be amplified, and term "coupled" or term "linked" is used to designate either a direct electric connection, or an indirect connection, that is, via one or a plurality of intermediate components.

Conventionally, an output stage of an RF amplifier may comprise one or a plurality of amplifying MOS transistors, the input signal to be amplified being applied to the gates of these transistors, and the output signal being supplied to the drain node (common-source assembly) or on the source node (common-drain assembly) of the transistors. As a variation, the transistors may be assembled with a common gate, the input and the output of the amplifier being then respectively formed by the source and by the drain of the transistor, and the gate being coupled to a node of application of a reference potential.

To determine the class and/or the operating range of the amplifier, a DC bias voltage superimposed to the input signal is generally applied to the gates of the amplifying MOS transistors. For an output stage configured to operate in class A or AB, bias voltage Vp1 of the output stage is greater than threshold voltage Vth of the amplifying transistors. Voltage Vp1 sets the quiescent current of the transistors of the output stage. For an output stage configured to operate in class B or C, bias voltage Vp2 of the output stage is smaller than or equal to threshold voltage Vth, so that the stage has a zero quiescent current, and only delivers power above a given input signal level. Thus, in existing multi-range amplifier architectures, the operating ranges of the output stages are adjusted via nodes located on the RF power path. To associate a plurality of output stages operating for different input signal amplitude ranges, RF power division and/or combiner circuits should thus be provided, to decouple the DC bias signals from the RF signal to be amplified. Such circuits are generally bulky and generate RF power losses.

Figure 2:
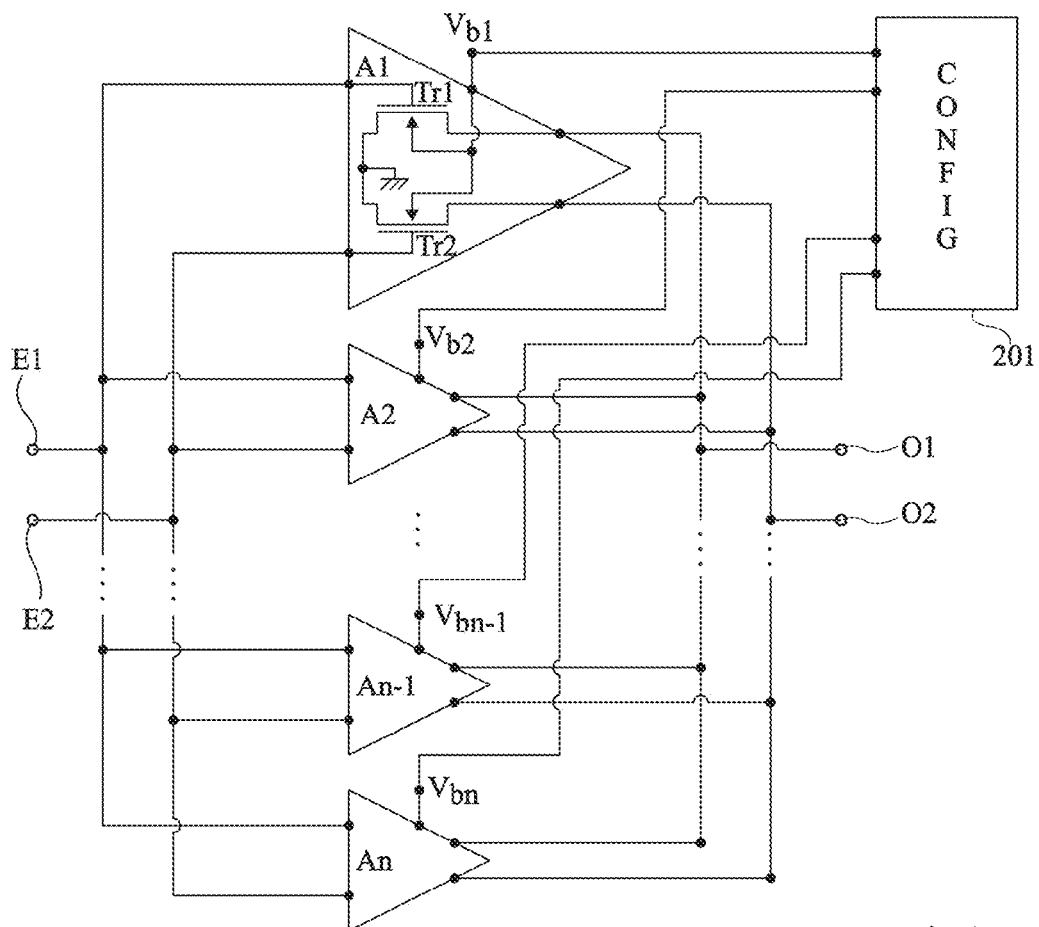
FIG. 2 schematically shows an example of an embodiment of a multi-range amplifier.

FIG. 2 schematically shows an embodiment of an amplifier comprising n output stages A1, A2, . . . , An−1, An configurable to operate for different input signal amplitude ranges, n being an integer greater than or equal to 2. In FIG. 2, only output stages A1 to An of the amplifier, as well as a circuit for configuring these output stages, have been shown.

In this example, each amplification stage Ai, i being an integer in the range from 1 to n, comprises at least one amplifying MOS transistor having its gate coupled to an input node common to all output stages, having a first conduction region (source or drain) coupled to an output node common to all output stages, and having its second conduction region (drain or source) coupled to a node of application of a reference potential common to all output stages. Preferably, the MOS transistors are assembled with a common source, that is, the first conduction region is the drain, and the second conduction region is the source. More particularly, in the shown example, each output stage Ai comprises a differential pair of N-channel MOS transistors Tr1 and Tr2, having their sources coupled (for example via an inductance) to a node GND of application of a reference potential common to all output stages, for example, the ground, and having their drains forming differential current outputs, and respectively coupled to output nodes O1 and O2 common to all output stages. The gates of transistors Tr1 and Tr2 form differential voltage inputs, and are respectively coupled to input nodes E1 and E2 common to all output stages. In other words, output stages A1 to An are coupled in parallel between input nodes E1, E2 and output nodes O1, O2 of the assembly of output stages. As a variation, the MOS transistors of stages A1 to An may be assembled with a common gate.

According to an aspect of the embodiment of FIG. 2, in each output stage Ai, the amplifying transistors have their bulk regions insulated from the bulk regions of the amplifying transistors of the other output stages. The "bulk region" of a MOS transistor, also sometimes called "body," is considered herein to refer to the semiconductor region in which the channel of the transistor is formed. In the shown example, in each output stage Ai, the bulk regions of amplifying transistors Tr1 and Tr2 of the stage are coupled to a same node $V_{bi}$ of application of a bias voltage. Bias nodes $V_{b1}$ to $V_{bn}$ of the bulk regions of output stages A1 to An are individually controllable, that is, they can receive different bias voltages.

The amplifier of FIG. 2 further comprises a configuration circuit 201 (CONFIG) capable of applying different bias voltages to bias nodes $V_{b1}$ to $V_{bn}$ of the different output stages. In this example, circuit 201 comprises n nodes for providing bias voltages, respectively coupled to the n bias nodes $V_{b1}$ to $V_{bn}$ of output stages A1 to An.

According to an aspect of the embodiment of FIG. 2, circuit 201 is capable of individually configuring the classes and operating ranges of the different output stages of the amplifier, by the application of appropriate configuration voltages to the bias nodes $V_{bi}$ of the different stages Ai. The application of a bias voltage to the bulk region of a MOS transistor indeed enables to modify threshold voltage Vth of this transistor, that is, the gate-source voltage from which this transistor becomes conductive and, accordingly, the amplitude range where the signals applied to the transistor gate are linearly amplified by the transistor.

A DC gate voltage, or common-mode voltage, may be applied to the gates of the MOS transistors, this voltage being then common to all output stages.

The amplifying MOS transistors of the output stages are preferably formed in FDSOI technology (fully depleted semiconductor on insulator). Indeed, in this technology, the variation range of threshold voltage Vth of a MOS transistor according to the bias voltage applied to its bulk region is relatively wide, which enables to adjust the operating range of each output stage Ai among a relatively wide amplitude range, and particularly to obtain different operating classes for different stages. As a variation, the amplifying MOS transistors of the output stages may be made in SOI technology (semiconductor-on-insulator), in FINFET technology (fin field-effect transistor), or in CMOS technology on a solid semiconductor substrate (insulation regions being then provided between the transistors of the different output stages). One will note that depending on the type of technology used, the bias node $V_{bi}$ of the bulk region of the MOS transistor may be directly connected to the bulk region of the transistor, which is the case for transistors formed by CMOS technology on a solid semiconductor substrate. Alternatively, the bias node $V_{bi}$ may be separated from the bulk region by an insulating layer, which is the case for transistors formed according to SOI and FDSOI technologies, in which the bias node $V_{bi}$ corresponds to the back gate of the transistor.

As an example, in the case of a 28-nm FDSOI technology, for an output stage configured to operate in class A or AB, the bias voltage applied to node $V_{bi}$ of the stage may be approximately zero. The gate may then be biased to a DC voltage Vg, for example, from 100 mV to 300 mV above threshold Vthi of the stage, according to the desired quiescent current. For an output stage configured to operate in class C, the bias voltage applied to node $V_{bi}$ of the stage may then be set to a positive value in the range from 0 to 1.8 V selected to increase threshold Vthi of the transistors with respect to the threshold of the class-A or class-AB amplifier, for example, so that this threshold is close to or slightly greater than voltage Vg.

An advantage of the embodiment of FIG. 2 is that the adjustment of the class and/or of the operating range of the different output stages Ai does not require applying different bias voltages on the RF power path of the different stages. Thus, as appears in FIG. 2, the inputs of the different output stages Ai (that is, the gates of the amplifying transistors of the different stages in this example) may be directly connected or coupled to one another. Further, the outputs of the different output stages Ai (that is, the drains of the amplifying transistors of the different stages in this example) may be directly interconnected. This enables to significantly decrease the bulk and losses with respect to existing multi-range amplifiers, in which RF power division and/or combiner circuits should be provided. This particularly enables to combine a larger number of output stages having different operating ranges (that is, capable of partially overlapping but each comprising a linear amplification area located outside of the linear amplification range of the other stages) than in existing architectures, for example, a number greater than or equal to 3. This particularly enables to increase the ratio between the delivered maximum power (or output compression point) and the bias current. The different output stages may be configured to successively start operating, gradually, when the RF power of the input signal increases. Thus, the embodiment of FIG. 2 enables to significantly improve the general efficiency of the amplifier with respect to existing architectures, particularly when the peak power-to-average power ratio of the signals to be amplified is high.

Preferably, the amplifying MOS transistors of the different output stages are of the same type, that is, for a same biasing potential of their bulk regions, their threshold voltages Vth are identical (to within manufacturing dispersions). This particularly eases the forming of the amplifier, and guarantees a similar or identical frequency behavior in all amplitude ranges of the input signal.

The amplifying MOS transistors of different output stages Ai may however have different dimensions, for example identical channel lengths and different channel widths, to have different amplifications gains and/or different saturation thresholds.

Further, the amplifying MOS transistors of the different output stages Ai are preferably integrated in a same semiconductor chip. Indeed, the embodiment described in relation with FIG. 2 is well suited to a particularly compact integration of the amplifier in an integrated circuit chip, since the power division and/or combiner circuits and/or the quarter wavelength lines (difficult to integrate) of known multi-range amplifier architectures, may be omitted.

FIG. 3 is a diagram schematically illustrating curves of transition between different operating ranges of an example of amplifier of the type described in relation with FIG. 2. More specifically, the case of an amplifier having four output stages A1, A2, A3, and A4 configured to operate in different amplitude ranges of the input signal is considered herein. FIG. 3 illustrates the variation of power Pout of the output signal according to power Pin of the input signal. When power Pin is smaller than a first threshold T1, amplification stage A1, configured in class A or AB, operates in a linear area of a transfer curve H(A1). Amplification stages A2, A3, and A4 then consume little or no current. When input power Pin exceeds threshold T1, amplification stage A1 enters a compression mode and then a saturation mode, as shown by the flattening of curve H(A1), and amplification stage A2, configured in class C, starts operating according to a gain expansion phenomenon illustrated by a transfer curve H(A2). Stage A1 then generates a clipped signal, and stage A2 only amplifies the portion of the input signal which exceeds threshold T1, the sum of the output signals of stages A1 and A2 then being relatively linear with respect to the output signals of each of the stages taken independently. When input power Pin exceeds a threshold T2 greater than threshold T1, amplification stage A2 saturates, as shown by the inflection of curve H(A2), and amplification stage A3, configured in class C, starts operating according to a transfer curve H(A3). Stage A2 then generates a clipped signal, and stage A3 only amplifies the portion of the input signal which exceeds threshold T2. The sum of the output signals of stages A2 and A3 is then relatively linear with respect to the output signals of each of the stages taken independently. When input power Pin exceeds a threshold T3 greater than threshold T2, amplification stage A3 saturates, as shown by the inflection of curve H(A3), and amplification stage A4, configured in class C, starts operating according to a transfer curve H(A4). Stage A3 then generates a clipped signal, and stage A4 only amplifies the portion of the input signal which exceeds threshold T3. The sum of the output signals of stages A3 and A4 is then relatively linear with respect to the output signals of each of the stages taken independently.

General output power Pout is formed by the sum of the outputs of the four amplification stages. Its variation is shown by a transfer curve H(A1+A2+A2+A3) (in dotted lines). Output stage A4 also ends up saturating, which is shown as a flattening of curves H(A4) and H(A1+A2+A3+A4).

Specific embodiments have been described. Various alterations, modifications, and improvements will readily occur to those skilled in the art.

In particular, the described embodiments are not limited to the specific example described in relation with FIG. 2 where each output stage comprises a differential pair of N-channel amplifying MOS transistors assembled with common sources. More generally, it will be within the abilities of those skilled in the art to obtain the desired operation whatever the internal structure of the output amplification stages, provided for the amplifying transistors to be MOS transistors having bulk regions capable of being biased differently in the different output stages.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An RF amplifier, comprising:
   at least two amplification stages coupled in parallel, each amplification stage comprising at least a first amplifying MOS transistor having a gate connected to a first input node common to all of said amplification stages, having a first source or drain region connected to a first output node common to all of said amplification stages, and having a bulk region insulated from bulk regions of amplifying MOS transistors in other amplification stages; and
   a configuration circuit configured to apply to each amplification stage, on a node for biasing the bulk region of said at least the first amplifying MOS transistor of the amplification stage, a voltage for configuring an operating range of the amplification stage, wherein different configuration voltages are applied to different amplification stages,
   wherein said at least the first amplifying MOS transistor of each of said at least two amplification stages has a same conductivity type.

2. The amplifier of claim 1, wherein each amplification stage further comprises a second amplifying MOS transistor having a gate connected to a second input node common to all amplification stages, having a first source or drain region connected to a second output node common to all amplification stages, and having a bulk region connected to the bulk region of the first amplifying MOS transistor of the amplification stage, the first and second amplifying MOS transistors having said same conductivity type.

3. The amplifier of claim 2, wherein, in each amplification stage, the first and second amplifying MOS transistors form a common-source differential pair.

4. The amplifier of claim 1, wherein each amplifying MOS transistor has a second source or drain region connected to a node of application of a reference potential common to all amplification stages.

5. The amplifier of claim 1, wherein said configuration circuit is configured to simultaneously configure at least one amplification stage in class A or class AB, and at least another amplification stage in class B or C.

6. The amplifier of claim 1, wherein said amplifying MOS transistors are transistors formed in SOI, FDSOI, or FINFET technology.

7. The amplifier of claim 1, wherein said amplification stages are integrated in a same semiconductor chip.

8. The amplifier of claim 1, wherein amplifying MOS transistors of different amplification stages have different dimensions.

9. An RF amplifier, comprising:
   a class A or class AB amplification stage including a first differential pair of MOS transistors having gate terminals coupled to first and second input nodes, respectively, and having bulk terminals coupled together at a first bias node;
   a class B or class C amplification stage including a second differential pair of MOS transistors having gate terminals coupled to said first and second input nodes, respectively, and having bulk terminals coupled together at a second bias node;
   wherein the first and second bias nodes are independent of each other; and
   a biasing circuit configured to apply a class A or class AB operating bias voltage to the first bias node and apply a class B or class C operating bias voltage to the second bias node.

10. The circuit of claim 9, wherein each of the first and second differential pairs of MOS transistors further have first conduction nodes coupled in common to a reference supply node and second conduction nodes coupled, respectively, to first and second output nodes.

11. The circuit of claim 9, wherein each of the first and second differential pairs of MOS transistors is implemented as an integrated transistor device formed in one of SOI, FDSOI, or FINFET technology.

12. The circuit of claim 9, wherein the first differential pair of MOS transistors and the second differential pair of MOS transistors have different dimensions.

13. The circuit of claim 9, wherein each of the first and second differential pairs of MOS transistors form a common-source differential pair.

14. An amplifier, comprising:
   a first amplification stage including a first differential pair of MOS transistors having gate terminals coupled to first and second input nodes, respectively, and having bulk terminals coupled together at a first bias node;
   a second amplification stage including a second differential pair of MOS transistors having gate terminals coupled to said first and second input nodes, respectively, and having bulk terminals coupled together at a second bias node;
   wherein MOS transistors of the first and second differential pairs of MOS transistors all have a same conductivity type;
   wherein the first and second bias nodes are independent of each other; and
   a biasing circuit configured to apply a first operating bias voltage to the first bias node to configure the first amplification stage for operation with a first threshold voltage and apply a second operating bias voltage to the second bias node to configured the second amplification stage for operation with a second threshold voltage different from the first threshold voltage.

15. The circuit of claim 14, wherein each of the first and second differential pairs of MOS transistors further have first conduction nodes coupled in common to a reference supply node and second conduction nodes coupled, respectively, to first and second output nodes.

16. The circuit of claim 14, wherein each of the first and second differential pairs of MOS transistors is implemented as an integrated transistor device formed in one of SOI, FDSOI, or FINFET technology.

17. The circuit of claim 14, wherein the first differential pair of MOS transistors and the second differential pair of MOS transistors have different dimensions.

18. The circuit of claim 14, wherein each of the first and second differential pairs of MOS transistors form a common-source differential pair.

19. The circuit of claim 14, wherein operation at the first threshold voltage configures the first amplification stage for operation in one of class A or class AB configuration, and wherein operation at the second threshold voltage configures the second amplification stage for operation in one of class B or class C configuration.

20. An RF amplifier, comprising:
at least two amplification stages coupled in parallel, each amplification stage comprising at least a first amplifying MOS transistor having a gate connected to a first input node common to all of said amplification stages, having a first source or drain region connected to a first output node common to all of said amplification stages, and having a bulk region insulated from bulk regions of amplifying MOS transistors in other amplification stages; and
a configuration circuit configured to apply to each amplification stage, on a node for biasing the bulk region of said at least the first amplifying MOS transistor of the amplification stage, a voltage for configuring an operating range of the amplification stage, wherein different configuration voltages are applied to different amplification stages;
wherein amplifying MOS transistors of different amplification stages have different dimensions.

21. The amplifier of claim 20, wherein each amplification stage further comprises a second amplifying MOS transistor having a gate connected to a second input node common to all amplification stages, having a first source or drain region connected to a second output node common to all amplification stages, and having a bulk region connected to the bulk region of the first amplifying MOS transistor of the amplification stage.

22. The amplifier of claim 21, wherein, in each amplification stage, the first and second amplifying MOS transistors form a common-source differential pair.

23. The amplifier of claim 20, wherein each amplifying MOS transistor has a second source or drain region connected to a node of application of a reference potential common to all amplification stages.

24. An RF amplifier, comprising:
at least two amplification stages coupled in parallel, each amplification stage comprising at least a first amplifying MOS transistor having a gate connected to a first input node common to all of said amplification stages, having a first source or drain region connected to a first output node common to all of said amplification stages, and having a bulk region insulated from bulk regions of amplifying MOS transistors in other amplification stages; and
a configuration circuit configured to apply to each amplification stage, on a node for biasing the bulk region of said at least the first amplifying MOS transistor of the amplification stage, a voltage for configuring an operating range of the amplification stage, wherein different configuration voltages are applied to different amplification stages;
wherein said configuration circuit is configured to simultaneously configure at least one amplification stage in class A or class AB, and at least another amplification stage in class B or C.

25. The amplifier of claim 24, wherein each amplification stage further comprises a second amplifying MOS transistor having a gate connected to a second input node common to all amplification stages, having a first source or drain region connected to a second output node common to all amplification stages, and having a bulk region connected to the bulk region of the first amplifying MOS transistor of the amplification stage.

26. The amplifier of claim 25, wherein, in each amplification stage, the first and second amplifying MOS transistors form a common-source differential pair.

27. The amplifier of claim 24, wherein each amplifying MOS transistor has a second source or drain region connected to a node of application of a reference potential common to all amplification stages.

28. An amplifier, comprising:
a first amplification stage including a first differential pair of MOS transistors having gate terminals coupled to first and second input nodes, respectively, and having bulk terminals coupled together at a first bias node;
a second amplification stage including a second differential pair of MOS transistors having gate terminals coupled to said first and second input nodes, respectively, and having bulk terminals coupled together at a second bias node;
wherein the first differential pair of MOS transistors and the second differential pair of MOS transistors have different dimensions;
wherein the first and second bias nodes are independent of each other; and
a biasing circuit configured to apply a first operating bias voltage to the first bias node to configure the first amplification stage for operation with a first threshold voltage and apply a second operating bias voltage to the second bias node to configured the second amplification stage for operation with a second threshold voltage different from the first threshold voltage.

29. The circuit of claim 28, wherein each of the first and second differential pairs of MOS transistors further have first conduction nodes coupled in common to a reference supply node and second conduction nodes coupled, respectively, to first and second output nodes.

30. The circuit of claim 28, wherein each of the first and second differential pairs of MOS transistors is implemented as an integrated transistor device formed in one of SOI, FDSOI, or FINFET technology.

31. The circuit of claim 28, wherein each of the first and second differential pairs of MOS transistors form a common-source differential pair.

32. An amplifier, comprising:
a first amplification stage including a first differential pair of MOS transistors having gate terminals coupled to first and second input nodes, respectively, and having bulk terminals coupled together at a first bias node;
a second amplification stage including a second differential pair of MOS transistors having gate terminals coupled to said first and second input nodes, respectively, and having bulk terminals coupled together at a second bias node;
wherein the first and second bias nodes are independent of each other; and
a biasing circuit configured to apply a first operating bias voltage to the first bias node to configure the first amplification stage for operation with a first threshold voltage and apply a second operating bias voltage to the second bias node to configured the second amplification stage for operation with a second threshold voltage different from the first threshold voltage; and wherein operation at the first threshold voltage configures the first amplification stage for operation in one of class A or class AB configuration, and wherein operation at the second threshold voltage configures the second amplification stage for operation in one of class B or class C configuration.

33. The circuit of claim 32, wherein each of the first and second differential pairs of MOS transistors further have first conduction nodes coupled in common to a reference supply node and second conduction nodes coupled, respectively, to first and second output nodes.

34. The circuit of claim 32, wherein each of the first and second differential pairs of MOS transistors is implemented as an integrated transistor device formed in one of SOI, FDSOI, or FINFET technology.

35. The circuit of claim 32, wherein each of the first and second differential pairs of MOS transistors form a common-source differential pair.

\* \* \* \* \*